US012787234B2

(12) United States Patent
Imanishi

(10) Patent No.: US 12,787,234 B2
(45) Date of Patent: Nov. 3, 2026

(54) POWER SUPPLY DEVICE

(71) Applicant: NHV CORPORATION, Kyoto (JP)

(72) Inventor: Tomoharu Imanishi, Kyoto (JP)

(73) Assignee: NHV CORPORATION, Kyoto (JP)

( * ) Notice: Subject to any disclaimer, the term of this patent is extended or adjusted under 35 U.S.C. 154(b) by 231 days.

(21) Appl. No.: 18/723,869

(22) PCT Filed: Jan. 12, 2023

(86) PCT No.: PCT/JP2023/000681
§ 371 (c)(1),
(2) Date: Jun. 25, 2024

(87) PCT Pub. No.: WO2023/140174
PCT Pub. Date: Jul. 27, 2023

(65) Prior Publication Data

US 2025/0081416 A1 Mar. 6, 2025

(30) Foreign Application Priority Data

Jan. 18, 2022 (JP) ................................ 2022-005870

(51) Int. Cl.
*H05K 7/20* (2006.01)
*H05K 9/00* (2006.01)

(52) U.S. Cl.
CPC ....... *H05K 7/20909* (2013.01); *H05K 9/0075* (2013.01)

(58) Field of Classification Search
CPC ..... H05K 7/20; H05K 7/20136-20145; H05K 7/20154; H05K 7/20172; H05K 7/20181; H05K 7/2019; H05K 7/20209; H05K 7/20409; H05K 7/20718; H05K 7/20736; H05K 7/209; H05K 7/20909; H05K 9/0075; H05G 1/10; H01J 37/241; H01J 33/02; G21K 5/10; H05H 5/02
See application file for complete search history.

(56) References Cited

U.S. PATENT DOCUMENTS

| | | | | |
|---|---|---|---|---|
| 6,654,242 B2 * | 11/2003 | Ogawa | H10W 40/43 | |
| | | | 361/679.48 | |
| 7,501,624 B1 | 3/2009 | Farrell et al. | | |
| 8,809,697 B2 | 8/2014 | Nicol et al. | | |

(Continued)

FOREIGN PATENT DOCUMENTS

| | | |
|---|---|---|
| CN | 101252821 | 8/2008 |
| CN | 211702805 | 10/2020 |

(Continued)

OTHER PUBLICATIONS

CN-215248886-U English Translation (Year: 2021).*

(Continued)

*Primary Examiner* — Amir A Jalali
(74) *Attorney, Agent, or Firm* — JCIPRNET

(57) ABSTRACT

A power supply device including a power supply device main body, a pressure tank, a cooler, an electric fan, and a magnetic shield member is provided. The pressure tank houses the power supply device main body. The cooler is provided inside the pressure tank. The electric fan is provided inside the pressure tank. The magnetic shield member is provided between the electric fan and the power supply device main body.

11 Claims, 5 Drawing Sheets

(56) References Cited

U.S. PATENT DOCUMENTS

| | | | | |
|---|---|---|---|---|
| 2017/0196098 A1* | 7/2017 | Inoue | H05K 7/20145 | |
| 2019/0200488 A1* | 6/2019 | Pal | H05K 7/20836 | |
| 2021/0029808 A1* | 1/2021 | Ishii | H05G 1/025 | |
| 2023/0171915 A1* | 6/2023 | Tsuchida | H05K 7/20336 | 361/697 |

FOREIGN PATENT DOCUMENTS

| | | | |
|---|---|---|---|
| CN | 215248886 | | 12/2021 |
| CN | 215248886 U | * | 12/2021 |
| JP | S58159657 | | 9/1983 |
| JP | H0984260 | | 3/1997 |
| JP | 2009011477 | | 1/2009 |
| TW | 200742537 | | 11/2007 |

OTHER PUBLICATIONS

"International Search Report (Form PCT/ISA/210) of PCT/JP2023/000681", mailed on Mar. 20, 2023, with English translation thereof, pp. 1-4.

"Office Action of Taiwan Counterpart Application", issued on Jan. 29, 2024, with English translation thereof, pp. 1-9.

"Examination report of India Counterpart Application", issued on Jun. 23, 2026, p. 1-p. 8.

* cited by examiner

POWER SUPPLY DEVICE

CROSS-REFERENCE TO RELATED APPLICATION

This application is a 371 application of the International PCT application serial no. PCT/JP2023/000681, filed on Jan. 12, 2023, which claims the priority benefits of Japan Patent Application No. 2022-005870, filed on Jan. 18, 2022. The entirety of each of the above-mentioned patent applications is hereby incorporated by reference herein and made a part of this specification.

TECHNICAL FIELD

The present invention relates to a power supply device used, for example, in an electron beam irradiation device.

BACKGROUND ART

For example, a power supply device used in an electron beam irradiation device or the like includes a power supply device main body for generating high voltage and a tank housing the power supply device main body. For example, in the power supply device described in Patent Document 1, a closed space is formed inside the tank. The tank is filled with, for example, electrically insulating gas. For example, the same power supply device supplies high voltage to an accelerating tube that accelerates electrons to generate an electron beam. Further, the same power supply device is also provided with a cooling mechanism to lower the temperature inside the tank. The cooling mechanism includes a cooler outside the tank. Gas in the tank flows into the cooler through piping. The gas cooled by the cooler flows into the tank again. The cooling mechanism maintains the temperature inside the tank at an appropriate level, allowing the power supply device to operate stably.

PRIOR ART DOCUMENT

Patent Document

Patent Document 1: Japanese Patent Application Laid-Open (JP-A) No. H09-84260

SUMMARY

Problems to be Solved by the Present Invention

Since the power supply device as disclosed in Patent Document 1 includes a cooler outside the tank, there is a problem in that the power supply device as a whole becomes larger. Thus, the present inventor studied a configuration in which the cooler is provided inside the tank. In that case, since the cooler is provided in a limited space within the tank, it is necessary to make the cooler smaller. However, if the cooler is made smaller, it becomes difficult to obtain sufficient cooling capacity, so there is room for improvement in this respect.

The present invention has been made to solve the above problems, and an object thereof is to provide a power supply device that is downsized and has improved cooling capacity.

Means for Solving the Problems

The power supply device for solving the above-mentioned problems includes: a power supply device main body; a tank, housing the power supply device main body; a cooler, provided inside the tank; an electric fan, provided inside the tank; and a magnetic shield member, provided between the electric fan and the power supply device main body.

According to this configuration, by providing the cooler inside the tank, the power supply device may be downsized. By providing an electric fan inside the tank, the gas, which has become high in temperature due to the heat generated by the power supply device main body inside the tank, may be sent to the cooler using the electric fan. That is, by forced convection caused by driving the electric fan, the temperature inside the tank may be efficiently lowered by the cooler. Further, with this configuration, the magnetism emitted from the power supply device main body may be shielded between the power supply device main body and the electric fan by the magnetic shield member. In this way, the electric fan is prevented from malfunctioning due to the magnetism emitted from the power supply device main body. Thus, the effect of improving the cooling capacity may be stably exhibited by the electric fan. In this way, according to this configuration, the cooling capacity may be improved while downsizing the power supply device.

In the power supply device, the cooler has cooling fins, and the magnetic shield member has a first shield portion positioned between the power supply device main body and the electric fan, and a second shield portion positioned between the power supply device main body and the cooling fin.

According to this configuration, the electric fan is shielded by the first shield portion and the cooling fins are shielded by the second shield portion against the magnetism of the power supply device main body. By shielding the cooling fins with the second shield portion, the cooling fins are suppressed from receiving magnetism and generating heat. Thus, a decrease in the cooling capacity of the cooler may be suppressed.

In the power supply device, a direction that is orthogonal to an opposing direction of the power supply device main body and the electric fan is referred to as an orthogonal direction, and the cooling fins are positioned on sides in the orthogonal direction with respect to the electric fan.

According to this configuration, the first shield portion and the second shield portion may be arranged in a line along the orthogonal direction in the magnetic shield member. Thus, the shape of the magnetic shield member having the first shield portion and the second shield portion may be simplified.

In the power supply device, the tank has a cylindrical shape with two ends closed, the power supply device main body is provided in a position that overlaps a center axis of the tank, and in a radial direction of the tank, the magnetic shield member is provided on an outer side of the power supply device main body, and the electric fan is provided on an outer side of the magnetic shield member.

According to this configuration, the electric fan is provided in a position closer to the inner circumferential surface of the tank with respect to the power supply device main body provided in a position closer to the center of the tank. In this way, the electric fan may be arranged in such a manner that the space within the tank is effectively utilized.

In the power supply device, the electric fan is provided so as to blow air from inside to outside in the radial direction, inside the tank, a pair of air flow paths are formed from an outside in the radial direction of the electric fan to two sides in an orthogonal direction of the electric fan that is orthogonal to an opposing direction between the power supply device main body and the electric fan, the cooler has a plurality of cooling fins, and the cooling fins are provided in each of the pair of air flow paths.

According to this configuration, the cooling fins are provided in each of the pair of air flow paths through which air from the electric fan passes. Thus, gas taken in from the power supply device main body side may be suitably blown to the cooling fins by the electric fan. As a result, the cooling efficiency of the cooler may be improved.

The power supply device described above is used as a power supply to supply power to an accelerating tube included in an electron beam irradiation device.

According to this configuration, the cooling capacity may be improved while downsizing the power supply device used in the electron beam irradiation device.

Effects of the Invention

The power supply device of the present invention exhibits the effect of improving cooling capacity while being downsized.

DESCRIPTION OF THE EMBODIMENTS

Figure 1:
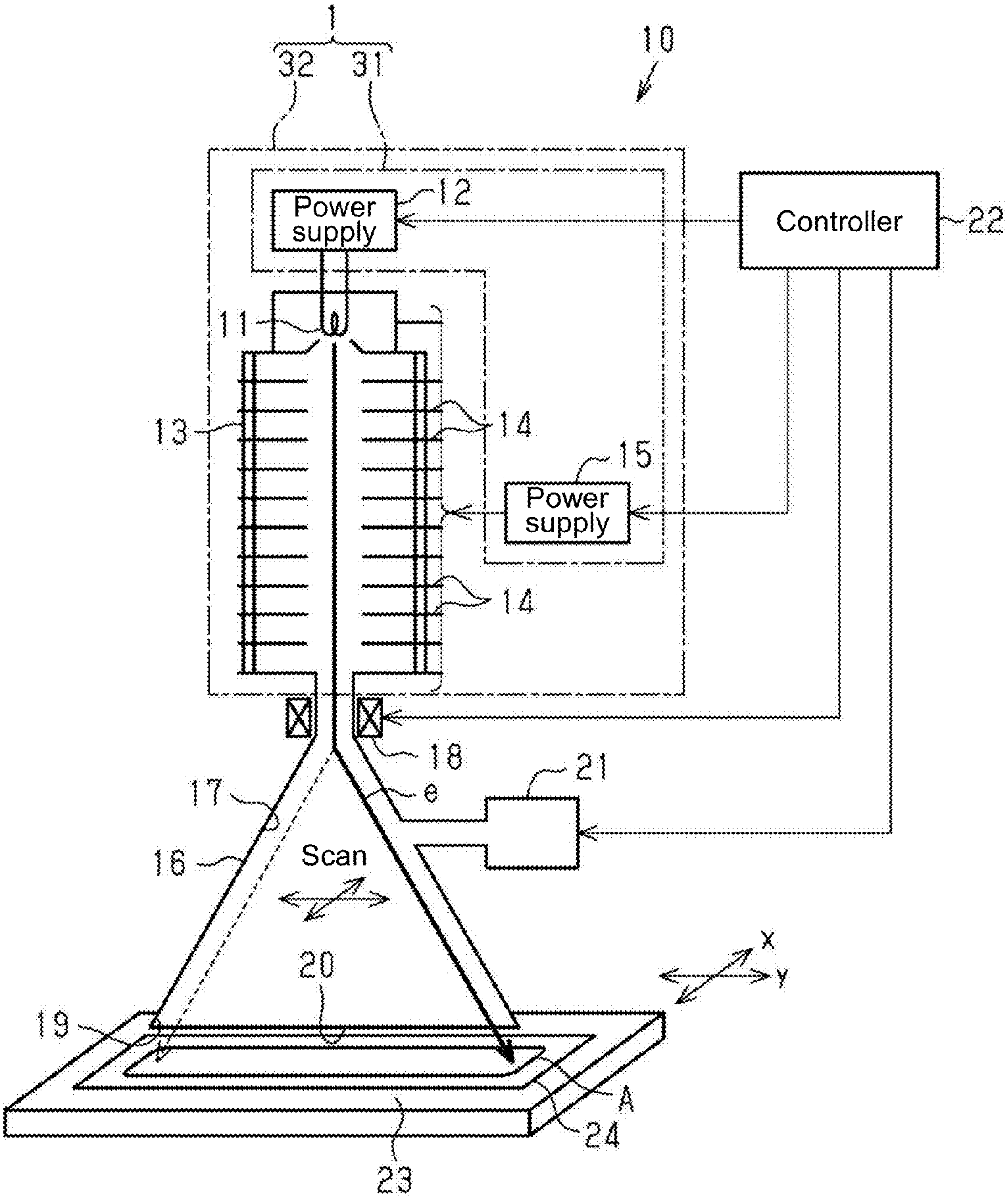
FIG. 1 is a schematic configuration diagram of the electron beam irradiation device in the embodiment.

Hereinafter, one embodiment of the power supply device will be described with reference to the drawings. In the drawings, for convenience, a part of the configuration may be exaggerated or simplified. Furthermore, the dimensional ratio of each part may also differ from the actual size. Furthermore, “orthogonal” in this description includes not only strictly orthogonal cases, but also approximately orthogonal cases within the range where the functions and effects of this embodiment may be achieved.

[Overall Configuration of Electron Beam Irradiation Device]

As shown in FIG. 1, the power supply device 1 of this embodiment is used, for example, as an electron beam irradiation device 10. The electron beam irradiation device 10 is, for example, a scanning type electron beam irradiation device. The electron beam radiation device 10 includes a filament 11 made of, for example, tungsten, which emits thermoelectrons. The filament 11 emits electrons by heating itself based on the power supplied from a power supply for filament 12 included in the power supply device main body 31. The filament 11 is provided on the upper end side of an accelerating tube 13.

The accelerating tube 13 has a cylindrical shape with a closed upper end where the filament 11 is provided. The accelerating tube 13 has a plurality of accelerating electrodes 14 arranged in parallel in the axial direction of the tube. The accelerating electrodes 14 generate an electric field that converges the electrons emitted from the filament 11 and accelerates the same downward based on the power supplied from a power supply for accelerating electrode 15 included in the power supply device main body 31. That is, in the accelerating tube 13, the electric field generated at the accelerating electrodes 14 cause an electron flow directed downward in the axial direction of the tube, that is, an electron beam e. A scanning tube 16 is connected to the lower end portion of the accelerating tube 13. The accelerating tube 13 and the scanning tube 16 communicate with each other through an internal space 17, and the electron beam e advances from the accelerating tube 13 toward the scanning tube 16 in that internal space 17.

The scanning tube 16 has a shape that is narrow at the upper end and widens toward the bottom. The scanning tube 16 is provided with a scanning coil 18 at the narrow upper end portion. The scanning coil 18 deflects the direction of the electron beam e generated by the accelerating tube 13, that is, scans the electron beam e, based on energization thereof. For example, a substantially rectangular-shaped opening window portion 19 is provided at the lower end portion of the scanning tube 16, and a substantially rectangular-shaped window foil 20 is attached to the opening window portion 19. The window foil 20 seals the opening window portion 19 while allowing the electron beam e to pass through. In other words, the internal space 17 spanning the accelerating tube 13 and the scanning tube 16 is configured as a closed space. The internal space 17 is kept in a vacuum state, for example, by driving a vacuum pump 21 connected to the scanning tube 16, at least during a period in which the electron beam e is generated.

The power supply for filament 12, the power supply for accelerating electrode 15, the scanning coil 18, and the vacuum pump 21 described above are controlled by a controller 22. The controller 22 performs output adjustment of the electron beam e through the power supply for filament 12 and the power supply for accelerating electrode 15, scanning control of the electron beam e through the scanning coil 18, vacuum adjustment of the internal space 17 of the accelerating tube 13 and the scanning tube 16 through the vacuum pump 21, and the like.

Then, the electron beam e emitted through the window foil 20 attached to the opening window portion 19 is, for example, irradiated onto an object 24 to be irradiated, which is conveyed in a conveying direction x by a conveying device 23. In this case, the electron beam irradiation device 10 is configured such that the longitudinal direction of the substantially rectangular-shaped opening window portion 19 faces a conveying orthogonal direction y of the conveying device 23. A predetermined scan of the electron beam e including the conveying direction x and the conveying orthogonal direction y is performed, and an irradiation on a substantially rectangular-shaped irradiation area A corresponding to the opening window portion 19 is performed. The effect of irradiating the object 24 to be irradiated with the electron beam e is expected to be, for example, improving the properties of the material, adding functionality, and sterilizing/sterilizing the material.

[Configuration of Power Supply Device 1]

Figure 2:
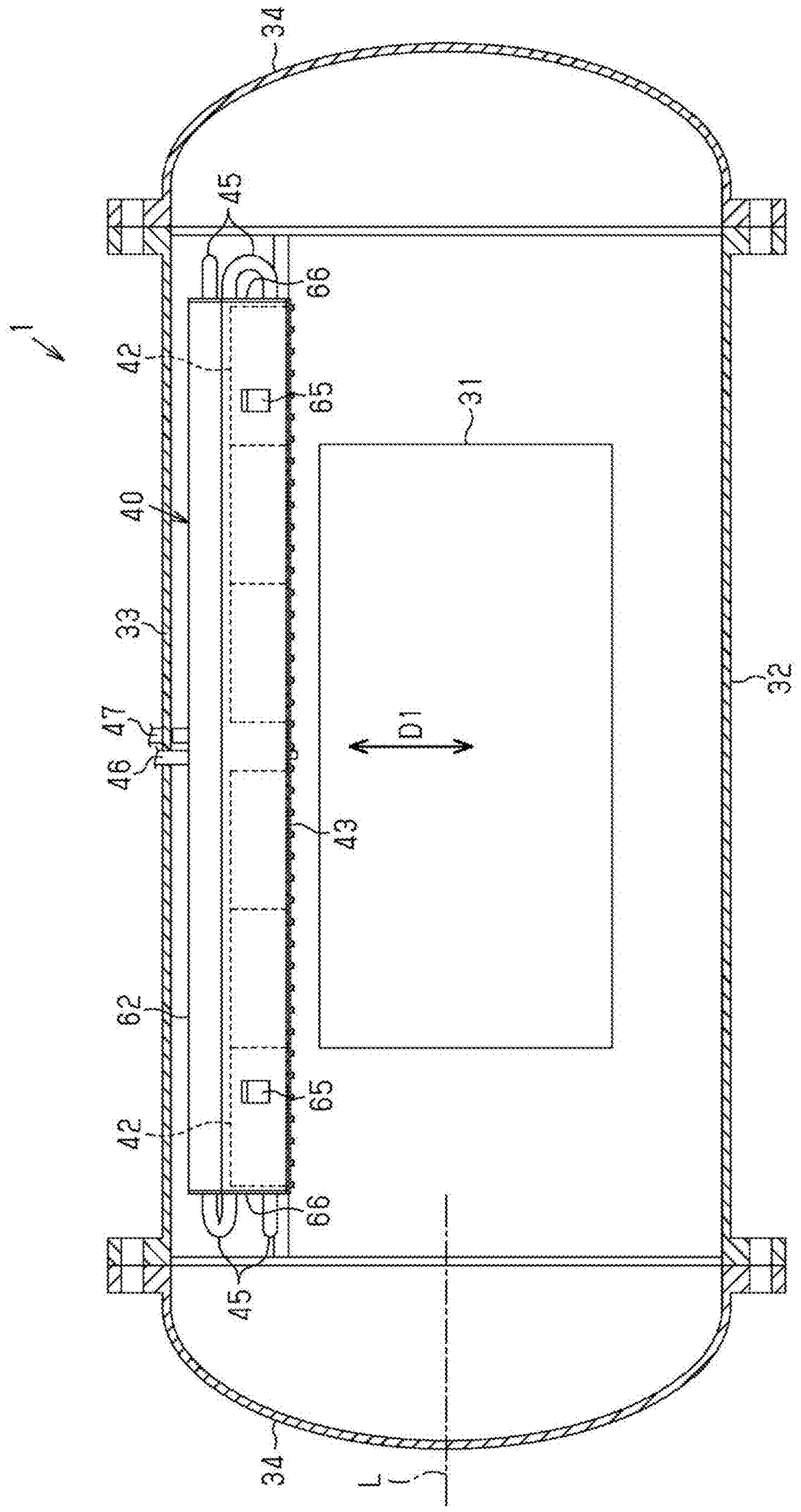
FIG. 2 is a cross-sectional view schematically showing the configuration inside the pressure tank in the power supply device of the same aspect.
Figure 4:
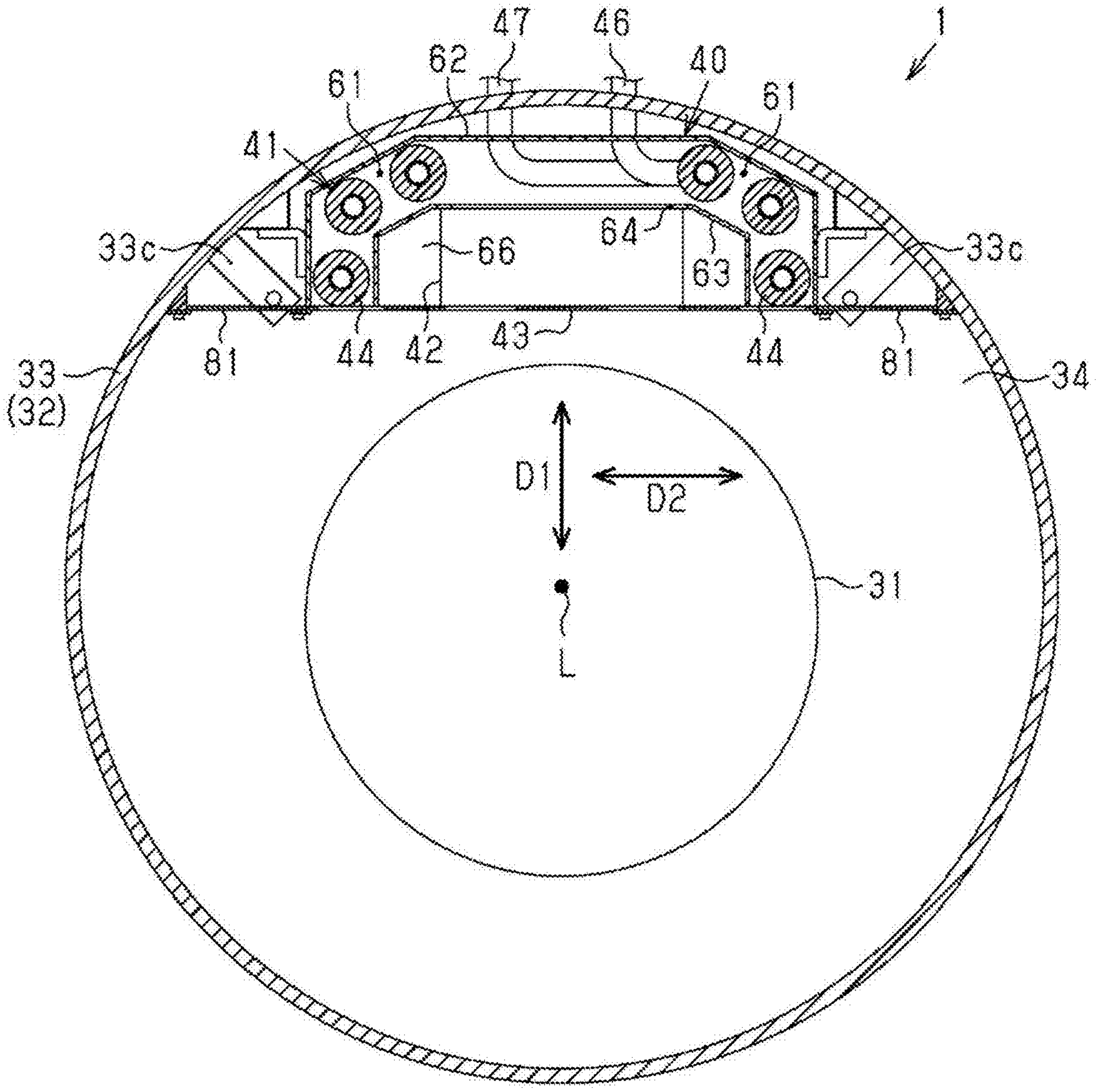
FIG. 4 is a cross-sectional view schematically showing the configuration inside the pressure tank in the power supply device of the same aspect.

As shown in FIG. 2 and FIG. 4, the power supply device 1 includes a power supply device main body 31 and a pressure tank 32 that houses the power supply device main body 31. For example, the accelerating tube 13 is housed in the pressure tank 32 of this embodiment. It is noted that in the case where the accelerating tube 13 is provided in the pressure tank 32, the pressure tank 32 has an emitting port (not shown) for emitting the electron beam e emitted from the accelerating tube 13 to the outside of the pressure tank 32. The pressure tank 32 is filled with, for example, electrically insulating gas such as SF6 gas. The pressure inside the pressure tank 32 is set to, for example, a high pressure of about 0.5 MPa. The pressure tank 32 is made of, for example, a conductor such as metal. It is noted that the pressure tank 32 is, for example, electrically grounded.

It is noted that FIG. 2 is a cross-sectional view showing the inner structure of the pressure tank 32, and is a view showing a state in which the pressure tank 32 is cut along the center axis L. Moreover, FIG. 4 is a cross-sectional view showing the inner structure of the pressure tank 32, and is a view showing a cross-sectional shape orthogonal to the center axis L.

As shown in FIG. 2, the pressure tank 32 includes a cylindrical peripheral wall 33 centered on the center axis L and bottom walls 34 provided at two end portions of the peripheral wall 33 in the direction along the center axis L. That is, the pressure tank 32 has a shape in which two ends of the cylindrical peripheral wall 33 are closed by a pair of bottom walls 34. The pressure tank 32 is composed of at least three divided bodies, for example, a part forming the peripheral wall 33, a part having one bottom wall 34, and a part having the other bottom wall 34.

As shown in FIG. 4, the peripheral wall 33 has, for example, a cylindrical shape with a center axis L as the center. That is, since the cross section of the peripheral wall 33 orthogonal to the center axis L is circular, it is suitable for withstanding the pressure inside the pressure tank 32. The power supply device main body 31 is provided on the inner side of the peripheral wall 33. Further, the power supply device main body 31 is provided in a position that overlaps the center axis L of the pressure tank 32.

[Configuration of Cooling Unit 40]

The electron beam irradiation device 10 is provided with a cooling unit 40 inside the pressure tank 32. The cooling unit 40 includes a cooler 41, an electric fan 42, and a magnetic shield member 43. That is, the cooler 41, the electric fan 42, and the magnetic shield member 43 included in the cooling unit 40 are provided inside the pressure tank 32. Further, the cooling unit 40 is provided in a position closer to the inner circumferential surface of the peripheral wall 33 of the pressure tank 32 with respect to the power supply device main body 31 provided in a position closer to the center axis L of the pressure tank 32.

As shown in FIG. 4, the cooler 41 includes a plurality of cooling fins 44 and a connecting pipe 45 that connects the cooling fins 44 to each other. The cooling fins 44 are, for example, aerofin tubes. The aerofin tube has a configuration in which a band-shaped heat dissipation plate is spirally provided around the outer circumference of the tube. Further, the cooling fins 44 are made of, for example, metal. Examples of the metal material used for the cooling fins 44 include stainless steel.

The cooling fins 44 are provided so that the length direction thereof runs along the center axis L. Further, the plurality of cooling fins 44 are connected in series by the connecting pipe 45. One of the plurality of cooling fins 44 is connected to an inflow side pipe 46 extending outside the pressure tank 32. Further, one of the plurality of cooling fins 44 is connected to an outflow side pipe 47 extending outside the pressure tank 32.

The cooler 41 of this embodiment is, for example, a water-cooled type. The water flowing into the cooling fins 44 from the inflow side pipe 46 receives heat from the cooling fins 44 and is then discharged from the outflow side pipe 47. It is noted that the cooling medium in the cooler 41 is not limited to water, and may be changed to other fluids.

It is noted that the connecting pipe 45, the inflow side pipe 46, and the outflow side pipe 47 are made of, for example, stainless steel. In the case where the connecting pipe 45, the inflow side pipe 46, and the outflow side pipe 47 are made of copper, which requires brazing, there is a risk of water leakage. In this regard, the possibility of water leakage may be reduced by making the connecting pipe 45, the inflow side pipe 46, and the outflow side pipe 47 of stainless steel that may be welded rather than brazed.

The magnetic shield member 43 is provided between the electric fan 42 and the power supply device main body 31. The magnetic shield member 43 is made of a conductive material such as a metal material. As the metal material forming the magnetic shield member 43, a material having high thermal conductivity, such as copper, is used. Further, the magnetic shield member 43, for example, has a thin plate shape.

The magnetic shield member 43 faces the power supply device main body 31 in the radial direction of the pressure tank 32. It is noted that in the following description, the radial direction of the pressure tank 32 may be simply referred to as "radial direction." Further, in the radial direction, the direction in which the power supply device main body 31 and the magnetic shield member 43 face each other is called an opposing direction D1.

The power supply device main body 31, the magnetic shield member 43, and the electric fan 42 are provided in a line along the radial direction of the pressure tank 32. That is, the electric fan 42 is provided on the outside in the radial direction of the magnetic shield member 43. Further, the electric fan 42 is provided between the power supply device main body 31 and the cooler 41 in the radial direction.

Figure 5:
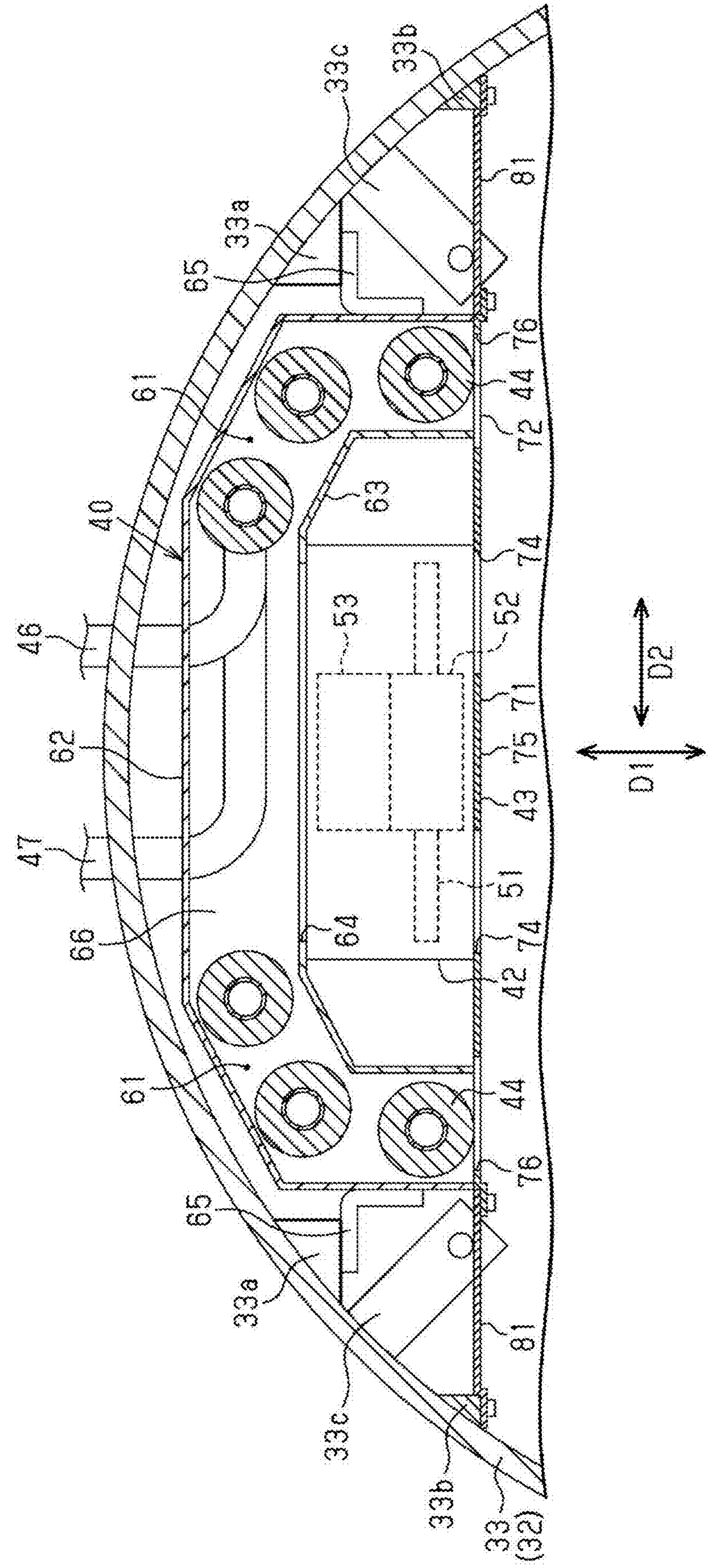
FIG. 5 is a cross-sectional view showing a part of FIG. 4 in an enlarged manner.

The cooling unit 40 includes, for example, a plurality of electric fans 42. The plurality of electric fans 42 are arranged in a line along the center axis L. As shown in FIG. 5, the electric fan 42 includes a fan body 52 having a blade portion 51 and a motor 53 as a drive source for rotating the fan body 52. The electric fan 42 blows air by rotating the fan body 52 driven by the motor 53. The electric fans 42 are provided so as to blow air from inside to outside in the radial direction. That is, the electric fans 42 take in air from the power supply device main body 31 side and blow the air to the cooler 41 side.

As shown in FIG. 5, the cooling unit 40 has a pair of air flow paths 61. The air flow paths 61 are formed from the outside in the radial direction of the electric fans 42 to two sides in an orthogonal direction D2 of the electric fans 42 that is orthogonal to the opposing direction D1 between the power supply device main body 31 and the electric fan 42. Specifically, the cooling unit 40 has an outer wall portion 62 and an inner wall portion 63. The outer wall portion 62 and the inner wall portion 63 have, for example, a thin plate shape made of metal. The air flow paths 61 are provided between the outer wall portion 62 and the inner wall portion 63. Further, the electric fans 42 are provided on the inside in the radial direction of the inner wall portion 63. Openings 64 are formed on the inner wall portion 63 at locations facing the electric fans 42 in the radial direction. Air from the electric fans 42 flows into the air flow paths 61 through the openings 64.

The outer wall portion 62 is supported by the pressure tank 32. Specifically, the outer wall portion 62 is provided with connecting pieces 65. The connecting pieces 65 are fixed to first fixed portions 33*a* extending from the inner circumferential surface of the peripheral wall 33 with screws or the like. As a result, the outer wall portion 62 is fixed to the pressure tank 32.

Side wall portions 66 are provided at two ends of the outer wall portion 62 in the direction along the center axis L, respectively. The side wall portions 66 close a space in which the air flow paths 61 and the electric fans 42 are housed in a direction along the center axis L. The inner wall portion 63 and the electric fans 42 are supported by the side wall portions 66.

A plurality of cooling fins 44 are provided inside the pair of air flow paths 61. Each cooling fin 44 is supported by, for example, the side wall portions 66. In each air flow path 61, the plurality of cooling fins 44 are arranged in a line along the air flow path 61. Further, each cooling fin 44 arranged in each of the pair of air flow paths 61 is positioned on sides in the orthogonal direction D2 with respect to the electric fans 42.

The magnetic shield member 43 has a first shield portion 71 and a second shield portion 72. The first shield portion 71 is positioned between the power supply device main body 31 and the electric fans 42 in the opposing direction D1. The second shield portion 72 is positioned between the power supply device main body 31 and the cooling fins 44 in the opposing direction D1. The first shield portion 71 and the second shield portion 72 are included in the plate-shaped magnetic shield member 43. That is, in the magnetic shield member 43, the first shield portion 71 and the second shield portion 72 are arranged in a line along the orthogonal direction D2. By magnetically shielding the cooling fins 44 by the second shield portion 72, the cooling fins 44 are prevented from receiving magnetism and generating heat.

Figure 3:
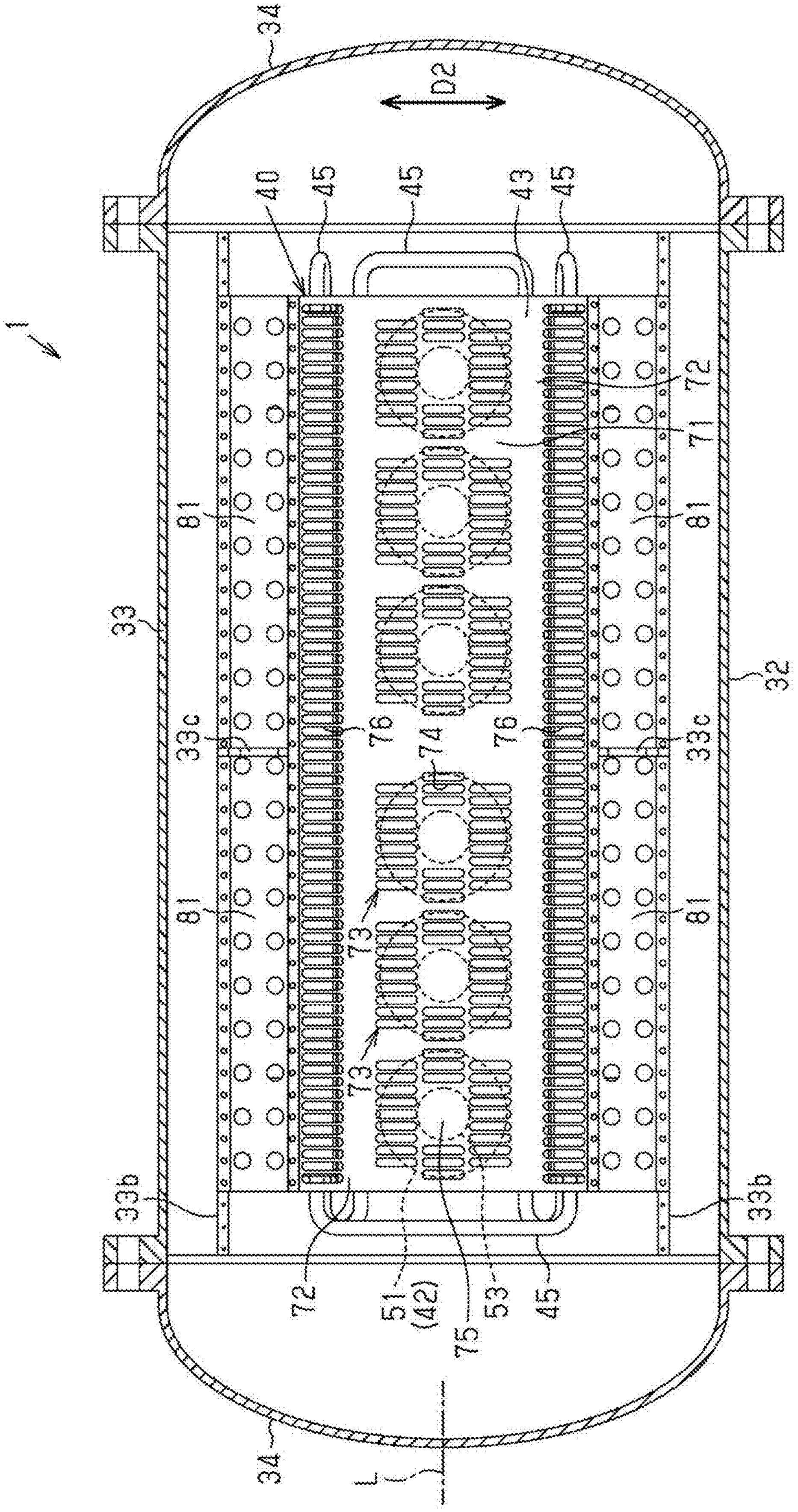
FIG. 3 is a cross-sectional view schematically showing the configuration inside the pressure tank in the power supply device of the same aspect.

FIG. 3 is a cross-sectional view showing the inner structure of the pressure tank 32, and is a view of the cooling unit 40 viewed from the opposing direction D1 between the power supply device main body 31 and the electric fan 42.

As shown in FIG. 3, the first shield portion 71 has a plurality of intake hole groups 73 corresponding to the plurality of electric fans 42, respectively. Each intake hole group 73 is provided so as to face each electric fan 42 in the opposing direction D1. Each intake hole group 73 includes a plurality of intake holes 74. Each intake hole 74 penetrates from the power supply device main body 31 side to the electric fan 42 side. Moreover, each intake hole 74 penetrates the first shield portion 71 in the opposing direction D1.

The intake hole 74 is provided so as to face the blade portion 51 of the electric fan 42 in the opposing direction D1. Further, the intake hole 74 is not provided in a position facing the motor 53, which are arranged in the center part of the electric fan 42, in the opposing direction D1. That is, the first shield portion 71 has a motor shield portion 75 that does not have an intake hole 74 in a position facing the motor 53 in the opposing direction D1.

The second shield portion 72 has an exhaust hole 76 that penetrates from the cooling fin 44 side to the power supply device main body 31 side. The exhaust hole 76 penetrates the second shield portion 72 in the opposing direction D1. For example, a plurality of exhaust holes 76 are provided along the center axis L. It is noted that the size of each intake hole 74 and each exhaust hole 76 is set to a size that does not allow the electromagnetic field calculated based on the magnetic frequency to penetrate.

As shown in FIG. 3 and FIG. 5, the cooling unit 40 includes side shield portions 81. The side shield portions 81 are provided on two sides of the magnetic shield member 43 in the orthogonal direction D2. The side shield portions 81 are fixed to the magnetic shield member 43 by, for example, screws or the like, and is also fixed to second fixed portions 33*b* extending from the inner circumferential surface of the peripheral wall 33 of the pressure tank 32. The side shield portions 81 wrap around the magnetic shield member 43 from sides in the orthogonal direction D2 and shields the magnetism acting on the outer wall portion 62. It is noted that the side shield portions 81 are formed of a conductive material such as a metal material. As the metal material forming the side shield portions 81, a material having high thermal conductivity, such as copper, is used. Further, the side shield portions 81, for example, have a thin plate shape.

The side shield portions 81 are, for example, divided into a plurality of parts in the direction along the center axis L. For example, support portions 33*c* extending from the inner circumferential surface of the peripheral wall 33 of the pressure tank 32 is provided between the two side shield portions 81 divided in the direction along the center axis L. The support portions 33*c* are for, for example, supporting the power supply device main body 31.

Next, the operation of this embodiment will be described.

The electric fans 42 take in gas around the power supply device main body 31 through the intake holes 74 of the first shield portion 71 and blow the gas into the pair of air flow paths 61. The gas blown into the pair of air flow paths 61 is cooled by each cooling fin 44 and exhausted from the exhaust hole 76 of the second shield portion 72 to the power supply device main body 31 side. In this way, in the configuration in which the magnetic shield member 43 has the first shield portion 71 and the second shield portion 72, the gas around the power supply device main body 31 may be suitably cooled.

The effects of this embodiment will be described.

(1) By providing the cooler 41 inside the pressure tank 32, the electron beam irradiation device 10 may be downsized as a whole. Further, by providing the electric fans 42 inside the pressure tank 32, the gas, which has become high in temperature due to the heat generated by the power supply device main body 31 inside the pressure tank 32, may be sent to the cooler 41 using the electric fans 42. That is, by forced convection caused by driving the electric fans 42, the temperature inside the pressure tank 32 may be efficiently lowered by the cooler 41. Further, in this embodiment, the magnetism emitted from the power supply device main body 31 may be shielded between the power supply device main body 31 and the electric fans 42 by the magnetic shield member 43. In this way, the electric fans 42 are prevented from malfunctioning due to the magnetism emitted from the power supply device main body 31. Thus, the effect of improving the cooling capacity may be stably exhibited by the electric fans 42. Thus, according to this embodiment, the cooling capacity may be improved while downsizing the electron beam irradiation device 10.

(2) The magnetic shield member 43 has a first shield portion 71 located between the power supply device main body 31 and the electric fans 42 and a second shield portion 72 located between the power supply device main body 31 and the cooling fins 44. According to this configuration, the electric fans 42 are shielded by the first shield portion 71 and the cooling fins 44 are shielded by the second shield portion 72 against the magnetism of the power supply device main body 31. By shielding the cooling fins 44 with the second shield portion 72, the cooling fins 44 are suppressed from receiving magnetism and generating heat. Thus, a decrease in the cooling capacity of the cooler 41 may be suppressed.

(3) The cooling fins 44 are positioned on sides in the orthogonal direction D2 with respect to the electric fans 42. According to this configuration, the first shield portion 71 and the second shield portion 72 may be arranged in a line along the orthogonal direction D2 in the magnetic shield member 43. Thus, the shape of the magnetic shield member 43 having the first shield portion 71 and the second shield portion 72 may be simplified.

(4) The pressure tank 32 has a cylindrical shape with two ends closed. The power supply device main body 31 is provided in a position that overlaps a center axis L of the pressure tank 32. In the radial direction of the pressure tank 32, the magnetic shield member 43 is provided on an outer side of the power supply device main body 31. The electric fans 42 are provided on an outer side of the magnetic shield member 43. According to this configuration, the electric fans 42 are provided in a position closer to the inner circumferential surface of the pressure tank 32 with respect to the power supply device main body 31 provided in a position closer to the center of the pressure tank 32. In this way, the electric fans 42 may be arranged in such a manner that the space within the pressure tank 32 is effectively utilized.

(5) The electric fans 42 are provided so as to blow air from inside to outside in the radial direction. In the electron beam irradiation device 10, inside the pressure tank 32, a pair of air flow paths 61 are formed from the outside in the radial direction of the electric fans 42 to two sides in an orthogonal direction D2 of the electric fans 42 that is orthogonal to an opposing direction D1 between the power supply device main body 31 and the electric fans 42. The cooler 41 has a plurality of cooling fins 44. The cooling fins 44 are provided in each of the pair of air flow paths 61. According to this configuration, the cooling fins 44 are provided in each of the pair of air flow paths 61 through which air from the electric fans 42 passes. Thus, gas taken in from the power supply device main body 31 side may be suitably blown to the cooling fins 44 by the electric fans 42. As a result, the cooling efficiency of the cooler 41 may be improved.

(6) The first shield portion 71 has a motor shield portion 75 that does not have an intake hole 74 in a position facing the motor 53 in the opposing direction D1. In this way, the motor 53 in the electric fan 42 may be suitably shielded by the motor shield portion 75.

This embodiment may be implemented with the following modifications. This embodiment and the following modifications may be implemented in combination with each other in a technically consistent range.

The magnetic shield member 43 of the above embodiment is formed from a plate-shaped material, such as a metal plate, but is not particularly limited thereto. For example, the magnetic shield member 43 may be a mesh member made of woven metal wires.

The side shield portions 81 of the above embodiment are formed from a plate-shaped material, such as a metal plate, but are not particularly limited thereto. For example, the side shield portions 81 may be mesh members made of woven metal wires.

The number of cooling fins 44 in the cooler 41 is not limited to the above embodiment, and may be changed as appropriate depending on the configuration of the electron beam irradiation device 10.

The number of electric fans 42 in the cooling unit 40 is not limited to the above embodiment including the drawings, and may be changed as appropriate depending on the configuration of the electron beam irradiation device 10.

The magnetic shield member 43 of the above embodiment has a second shield portion 72 that shields the cooling fins 44, but is not particularly limited thereto. For example, the second shield portion 72 may be omitted from the magnetic shield member 43 of the above embodiment, and the magnetic shield member 43 may shield only the electric fans 42.

The positional relationship among the power supply device main body 31, the electric fans 42, and the cooling fins 44 is not limited to the above embodiment, and may be changed as appropriate depending on the configuration of the electron beam irradiation device 10.

Although the accelerating tube 13 of the above embodiment is housed in the pressure tank 32, the present invention is not limited thereto, and the accelerating tube 13 may be housed in a separate container from the pressure tank 32.

In the above embodiment, the pressure tank 32 that may make the internal pressure higher than the standard atmospheric pressure is used as the tank in which the power supply device main body 31 and the cooling unit 40 are housed. However, the tank is not particularly limited thereto, and may be a tank that does not have a function of making the internal pressure higher than the standard atmospheric pressure.

In the above embodiment, a power supply device 1 used in the electron beam irradiation device 10 is realized, but the present invention may be applied to a power supply device used in devices other than the electron beam irradiation device 10.

The embodiments and modifications disclosed herein are illustrative in all respects, and the present invention is not limited to these exemplifications. That is, the scope of the present invention is indicated by the claims, and it is intended to include the equivalent of the scope of the claims and all modifications within the scope.

The invention claimed is:

1. A power supply device, comprising:
a power supply device main body;
a tank, housing the power supply device main body;
a cooler, provided inside the tank;
an electric fan, provided inside the tank; and
a magnetic shield member, provided between the electric fan and the power supply device main body, wherein
the cooler has cooling fins, and
the magnetic shield member has a first shield portion positioned between the power supply device main body and the electric fan and a second shield portion positioned between the power supply device main body and the cooling fins.

2. The power supply device according to claim 1, wherein
a direction that is orthogonal to an opposing direction of the power supply device main body and the electric fan is referred to as an orthogonal direction, and
the cooling fins are positioned on sides in the orthogonal direction with respect to the electric fan.

3. The power supply device according to claim 2, wherein
the tank has a cylindrical shape with two ends closed,
the power supply device main body is provided in a position that overlaps a center axis of the tank, and
in a radial direction of the tank, the magnetic shield member is provided on an outer side of the power supply device main body, and the electric fan is provided on an outer side of the magnetic shield member.

4. The power supply device according to claim 2, which is used as a power supply to supply power to an accelerating tube included in an electron beam irradiation device.

5. The power supply device according to claim 1, wherein the tank has a cylindrical shape with two ends closed, the power supply device main body is provided in a position that overlaps a center axis of the tank, and in a radial direction of the tank, the magnetic shield member is provided on an outer side of the power supply device main body, and the electric fan is provided on an outer side of the magnetic shield member.

6. The power supply device according to claim 5, wherein the electric fan is provided so as to blow air from inside to outside in the radial direction, inside the tank, a pair of air flow paths are formed from the outside in the radial direction of the electric fan to two sides in an orthogonal direction of the electric fan that is orthogonal to an opposing direction between the power supply device main body and the electric fan, and the cooling fins are provided in each of the pair of air flow paths.

7. The power supply device according to claim 6, which is used as a power supply to supply power to an accelerating tube included in an electron beam irradiation device.

8. The power supply device according to claim 5, which is used as a power supply to supply power to an accelerating tube included in an electron beam irradiation device.

9. The power supply device according to claim 1, which is used as a power supply to supply power to an accelerating tube included in an electron beam irradiation device.

10. The power supply device according to claim 1, wherein the tank has a cylindrical shape with two ends closed, the power supply device main body is provided in a position that overlaps a center axis of the tank, and in a radial direction of the tank, the magnetic shield member is provided on an outer side of the power supply device main body, and the electric fan is provided on an outer side of the magnetic shield member.

11. The power supply device according to claim 1, which is used as a power supply to supply power to an accelerating tube included in an electron beam irradiation device.

* * * * *